US012787574B2

(12) United States Patent
Kim et al.

(10) Patent No.: US 12,787,574 B2
(45) Date of Patent: Nov. 3, 2026

(54) LIGHT EMITTING DISPLAY APPARATUS HAVING REDUCED SIGNAL LINE PARASITIC CAPACITANCE

(71) Applicant: LG Display Co., Ltd., Seoul (KR)

(72) Inventors: KangIl Kim, Paju-si (KR); Wondoo Kim, Paju-si (KR); Minkyu Chun, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 435 days.

(21) Appl. No.: 18/497,880

(22) Filed: Oct. 30, 2023

(65) Prior Publication Data

US 2024/0179982 A1 May 30, 2024

(30) Foreign Application Priority Data

Nov. 29, 2022 (KR) ........................ 10-2022-0162249

(51) Int. Cl.
*H10K 59/131* (2023.01)
*G09G 3/32* (2016.01)
*H10K 59/35* (2023.01)

(52) U.S. Cl.
CPC ............. *H10K 59/131* (2023.02); *G09G 3/32* (2013.01); *H10K 59/353* (2023.02); *G09G 2300/0819* (2013.01); *G09G 2300/0842* (2013.01); *G09G 2300/0861* (2013.01); *G09G 2330/021* (2013.01); *H10K 59/351* (2023.02)

(58) Field of Classification Search
CPC .. H10K 59/131; H10K 59/353; H10K 59/351; H10K 59/1213; H10K 59/88; G09G 3/32; G09G 3/3233; G09G 2300/0819; G09G 2300/0842; G09G 2300/0861; G09G 2330/021; H10D 86/441; H10D 86/60; H10H 29/142
See application file for complete search history.

(56) References Cited

U.S. PATENT DOCUMENTS

2022/0037440 A1* 2/2022 Jang .................. H10K 59/1216

FOREIGN PATENT DOCUMENTS

| | | | | |
|---|---|---|---|---|
| KR | 20180057777 A | | 5/2018 | |
| KR | 20190038150 A | | 4/2019 | |
| KR | 20190131254 A | | 11/2019 | |
| KR | 20200009671 A | | 1/2020 | |
| KR | 20220015827 A | | 2/2022 | |
| KR | 20220030884 A | * | 3/2022 | ........... G09G 3/3291 |

* cited by examiner

*Primary Examiner* — William B Partridge
*Assistant Examiner* — Chevy J Boegel
(74) *Attorney, Agent, or Firm* — Seed Intellectual Property Law Group LLP

(57) ABSTRACT

A light emitting display apparatus includes a plurality of pixels each including a plurality of subpixels, a plurality of data lines respectively connected with the plurality of subpixels, and a plurality of reference lines in each of the plurality of pixels. Each of the plurality of subpixels includes a pixel circuit connected with a corresponding data line and a corresponding reference line and a light emitting device layer connected with the pixel circuit. A first subpixel group among the plurality of subpixels in each of the plurality of pixels is connected with a corresponding reference line, and a second subpixel group except the first subpixel group among the plurality of subpixels in each of the plurality of pixels is connected with a reference line connected with an adjacent different pixel.

19 Claims, 12 Drawing Sheets

DL : $DL_G$, $DL_R$, $DL_W$, $DL_B$ REF : REF0, REF1, REF2

DL : $DL_G$, $DL_R$, $DL_W$, $DL_B$
REF : REF0, REF1, REF2
REFh : REFh1, REFh2, REFh3

LIGHT EMITTING DISPLAY APPARATUS HAVING REDUCED SIGNAL LINE PARASITIC CAPACITANCE

CROSS-REFERENCE TO RELATED APPLICATIONS

This application claims the benefit of the Korean Patent Application No. 10-2022-0162249 filed on Nov. 29, 2022, which is hereby incorporated by reference as if fully set forth herein.

BACKGROUND

Technical Field

The present disclosure relates to a light emitting display apparatus.

Description of the Related Art

Light emitting display apparatuses have a high response speed and low power consumption and self-emit light without a separate light source unlike liquid crystal display (LCD) apparatuses, and thus, are attracting much attention as next-generation flat display apparatuses.

Light emitting display apparatuses display an image by using light emitted from a light emitting device including an emission layer disposed between two electrodes.

Light emitting display apparatuses include a plurality of subpixels including a light emitting device and a pixel circuit. The pixel circuit includes a switching thin film transistor (TFT), a driving TFT, and a capacitor for controlling emitting of light from the light emitting device. The light emitting device is provided in an emission region of a pixel area and emits light, based on a data signal supplied from the pixel circuit.

Transistors provided in the pixel circuit of each of the plurality of subpixels are driven by a voltage or a signal applied through a horizontal signal line and a vertical signal line disposed on a substrate.

However, due to a parasitic capacitance formed in an overlap region (or an intersection region) between the horizontal signal line and the vertical signal line, signal delay may occur in the voltage or the signal applied to the transistors provided in the pixel circuit of each of the plurality of subpixels. Due to this, a load and ripple may occur due to an overlap area between the horizontal signal line and the vertical signal line, and a charge rate of a light emitting display apparatus may be reduced.

BRIEF SUMMARY

Accordingly, the present disclosure is directed to providing a light emitting display apparatus that substantially obviates one or more problems due to limitations and disadvantages of the related art.

An aspect of the present disclosure is directed to providing a light emitting display apparatus in which an overlap area between lines may be reduced, and the occurrence of a load and ripple between the lines caused by the overlap area may decrease, thereby enhancing a charge rate and display quality.

Additional advantages and features of the disclosure will be set forth in part in the description which follows and in part will become apparent to those having ordinary skill in the art upon examination of the following or may be learned from practice of the disclosure. The technical features and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display apparatus includes a plurality of pixels each including a plurality of subpixels, a plurality of data lines respectively connected with the plurality of subpixels, and a plurality of reference lines in each of the plurality of pixels, wherein each of the plurality of subpixels includes a pixel circuit connected with a corresponding data line and a corresponding reference line, and a light emitting device layer connected with the pixel circuit. A first subpixel group among the plurality of subpixels in each of the plurality of pixels is connected with a corresponding reference line, and a second subpixel group except the first subpixel group among the plurality of subpixels in each of the plurality of pixels is connected with another reference line connected with an adjacent different pixel.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

In a light emitting display apparatus according to the present disclosure, an overlap area between lines may be reduced, and the occurrence of a load and ripple between the lines caused by the overlap area may decrease, thereby enhancing a charge rate and display quality.

In the light emitting display apparatus according to the present disclosure, as a charge rate is enhanced, power consumption may be reduced, and thus, the light emitting display apparatus may be driven with low power.

It is to be understood that both the foregoing general description and the following detailed description of the present disclosure are examples and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
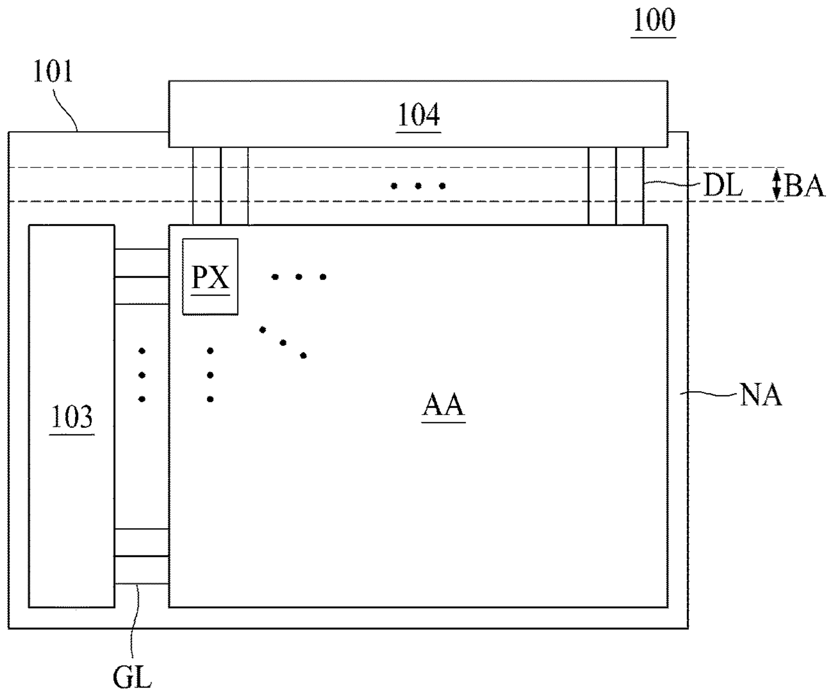
FIG. 1 is a diagram schematically illustrating a light emitting display apparatus according to the present disclosure.

Reference will now be made in detail to the example embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as, for example, "on." "over," "under," and "next." one or more other parts may be disposed between the two parts unless a more limiting term, such as "just" or "direct(ly)" is used.

In describing a time relationship, for example, when the temporal order is described as, for example, "after." "subsequent." "next." and "before." a case that is not continuous may be included unless a more limiting term, such as "just." "immediate(ly)," or "direct(ly)" is used.

It will be understood that, although the terms "first." "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second." "A," "B." "(a)." "(b)," etc., may be used. These terms are intended to identify the corresponding elements from the other elements, and basis, order, or number of the corresponding elements should not be limited by these terms. The expression that an element is "connected." "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a display apparatus according to the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

FIG. 1 is a diagram schematically illustrating a light emitting display apparatus according to the present disclosure.

Referring to FIG. 1, a display apparatus 100 according to an embodiment of the present disclosure may include a display panel 101. The display panel 101 may include a display area AA where a plurality of subpixels PX are provided and a non-display area NA which is disposed at a periphery of the display area AA.

The subpixel PX of the display area AA may include a thin film transistor (TFT) which uses an oxide semiconductor material as an active layer.

A plurality of data lines DL and a plurality of gate lines GL may be arranged in the display area AA. For example, the plurality of data lines DL may be arranged in rows or columns, and the plurality of gate lines GL may be arranged in rows or columns. Also, the subpixel PX may be provided in an area defined by or associated with the data line DL and the gate line GL.

The plurality of gate lines GL may include a plurality of scan lines and a plurality of emission control lines. The plurality of scan lines and the plurality of emission control lines may transfer different kinds of gate lines (for example, a scan signal and an emission control signal) to gate nodes of different kinds of transistors (for example, a scan transistor and an emission control transistor) disposed in the subpixel PX.

One of a data driver 104 and a gate driver 103 may be disposed in the non-display area NA. Also, the non-display area NA may further include a bending region BA where a substrate of the display panel 101 is bent, but embodiments of the present disclosure are not limited thereto. For example, the bending region BA may be provided in the display area AA.

The gate driver 103 may include a TFT which is directly formed on the substrate of the display panel 101. For example, the gate driver 103 may include a TFT including a polycrystalline silicon semiconductor layer, a TFT including an oxide semiconductor layer, or the TFT including the polycrystalline silicon semiconductor layer and the TFT including the oxide semiconductor layer, which are paired. In a case where TFTs respectively disposed in the non-display area NA and the display area AA includes the same semiconductor material, the TFTs respectively disposed in the non-display area NA and the display area AA may be simultaneously performed in the same process.

In the TFT including the polycrystalline silicon semiconductor layer and the TFT including the oxide semiconductor layer, electron mobility may be high in a channel, and thus, a high resolution and low power may be implemented.

The gate driver 103 may supply a scan signal having a gate-on voltage to the plurality of gate lines GL sequentially or in a predetermined or selected order, and thus, may drive pixel rows of the display area AA sequentially or in a predetermined or selected order. Here, the gate driver 103 may be referred to as a scan driver. Here, the pixel row may denote a row which is configured with pixels connected to one gate line. As in the display apparatus according to an embodiment of the present disclosure, the gate driver 103 may be implemented as a gate in panel (GIP) type and may be directly disposed on the substrate 110. The gate driver 103 may include a shift register and a level shifter.

The gate driver 103 may include a scan driving circuit which outputs scan signals to a plurality of scan lines corresponding to one kind of the gate line GL and an emission driving circuit which outputs emission control signals to the plurality of emission control lines corresponding to the other kind of the gate line GL.

The display apparatus 100 according to an embodiment of the present disclosure may further include the data driver 104. Also, the data driver 104 may convert image data into analog data voltages, and when a specific gate line is driven by the gate driver 103, the data driver 104 may supply the data voltages to the plurality of data lines DL.

The data line DL may be disposed to pass through the bending region BA, and various data lines DL may be disposed and may be connected with the data driver 104 through a data pad.

The bending region BA may be a region where the substrate of the display panel 101 is bent. The substrate of the display panel 101 may maintain a flat state in a region except the bending region BA.

Figure 2:
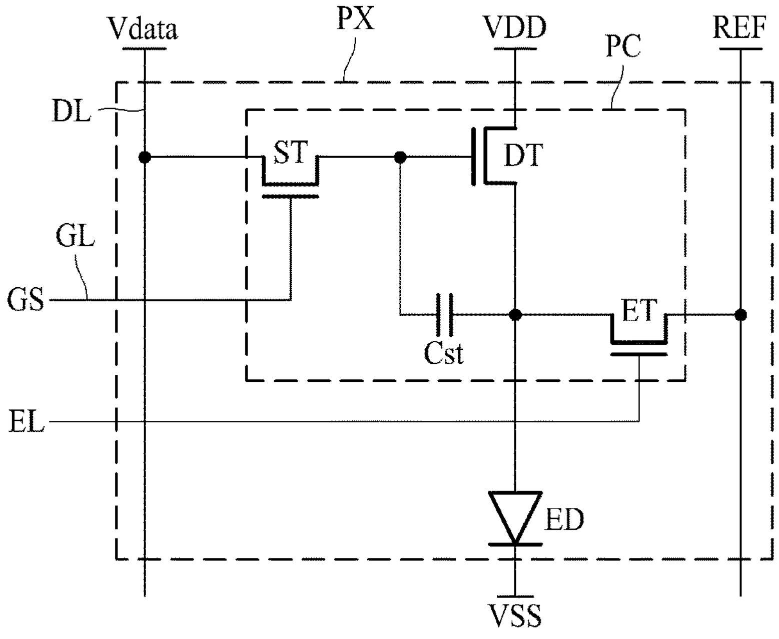
FIG. 2 is an equivalent circuit diagram illustrating a pixel illustrated in FIG. 1.

FIG. 2 is an equivalent circuit diagram illustrating a pixel illustrated in FIG. 1.

Referring to FIG. 2, each subpixel PX of a light emitting display apparatus according to an embodiment of the present disclosure may include a pixel circuit PC and a light emitting device ED.

The pixel circuit PC may be provided in a circuit region of a pixel area defined by or associated with a gate line GL and a data line DL and may be connected with an adjacent gate line GL, an adjacent data line DL, and a first driving power line VDD. The pixel circuit PC may control the emission of light from the light emitting device ED with a data voltage Vdata from the data line DL in response to a gate-on signal GS from the gate line GL. The pixel circuit PC according to an embodiment may include a switching TFT ST, a driving TFT DT, a capacitor Cst, and a sensing TFT ET.

The switching TFT ST may include a gate electrode connected with the gate line GL, a first electrode connected with the data line DL, and a second electrode connected with a gate electrode of the driving TFT DT. For example, the first electrode and the second electrode may be a source electrode and a drain electrode or may be a drain electrode and a source electrode. However, embodiments of the present disclosure are not limited thereto, and a source region of an active layer having conductivity may be connected with the data line DL and a drain region of the active region having conductivity may be connected with the gate electrode of the driving TFT DT. The switching TFT ST may be turned on based on the gate-on signal GS supplied through the gate line GL and may supply the data voltage Vdata, supplied through the data line DL, to the gate electrode of the driving TFT DT.

The driving TFT DT may include a gate electrode connected with the second electrode of the switching TFT ST, a third electrode connected with the first driving power line VDD, and a fourth electrode connected with the light emitting device ED. For example, the third electrode and the fourth electrode may be a source electrode and a drain electrode or may be a drain electrode and a source electrode. However, embodiments of the present disclosure are not limited thereto, and in a top gate type, the source region of the active layer having conductivity may be connected with the first driving power line VDD and a drain region of the active region having conductivity may be connected with the light emitting device ED.

The driving TFT DT may be turned on with a gate-source voltage based on the data voltage Vdata supplied from the switching TFT ST and may control a data signal supplied through the first driving power line VDD to the light emitting device ED.

The capacitor Cst may be connected between the gate electrode and the fourth electrode of the driving TFT DT, may store a voltage corresponding to the data voltage Vdata supplied to the gate electrode of the driving TFT DT, and may turn on the driving TFT DT with the stored voltage. At this time, the capacitor Cst may maintain the turn-on state of the driving TFT DT until the data voltage Vdata is supplied thereto through the switching TFT ST in a next frame.

The light emitting device ED may be provided in an emission region of the pixel area and may emit light, based on a data signal supplied from the pixel circuit PC. For example, the light emitting device ED may include an anode electrode connected with the fourth electrode of the driving TFT DT, a cathode electrode connected with a second driving power line VSS, and an emission layer provided between the anode electrode and the cathode electrode. Here, the emission layer may include one of an organic emission layer, an inorganic emission layer, and a quantum dot emission layer, or may include a stack or combination structure of an organic emission layer (or an inorganic emission layer) and a quantum dot emission layer.

The sensing TFT ET may be a circuit which is additionally provided in a pixel, so as to compensate for a threshold voltage Vth of the driving TFT DT. The sensing TFT ET may be connected (or with a sensing node) between the fourth electrode of the driving TFT DT and the anode electrode of the light emitting device ED. The sensing TFT ET may be activated by a sensing control line EL. The sensing TFT ET may supply the sensing node with an initialization voltage (or a sensing voltage) transferred through a reference line REF, or may operate to sense (detect) a voltage or a current of the sensing node.

As described above, each subpixel PX of the light emitting display apparatus according to an embodiment of the present disclosure may control the data signal supplied to the light emitting device ED with a gate-source voltage of the driving TFT DT based on the data voltage Vdata to allow the light emitting device ED to emit light, thereby displaying a certain image.

Figure 3:
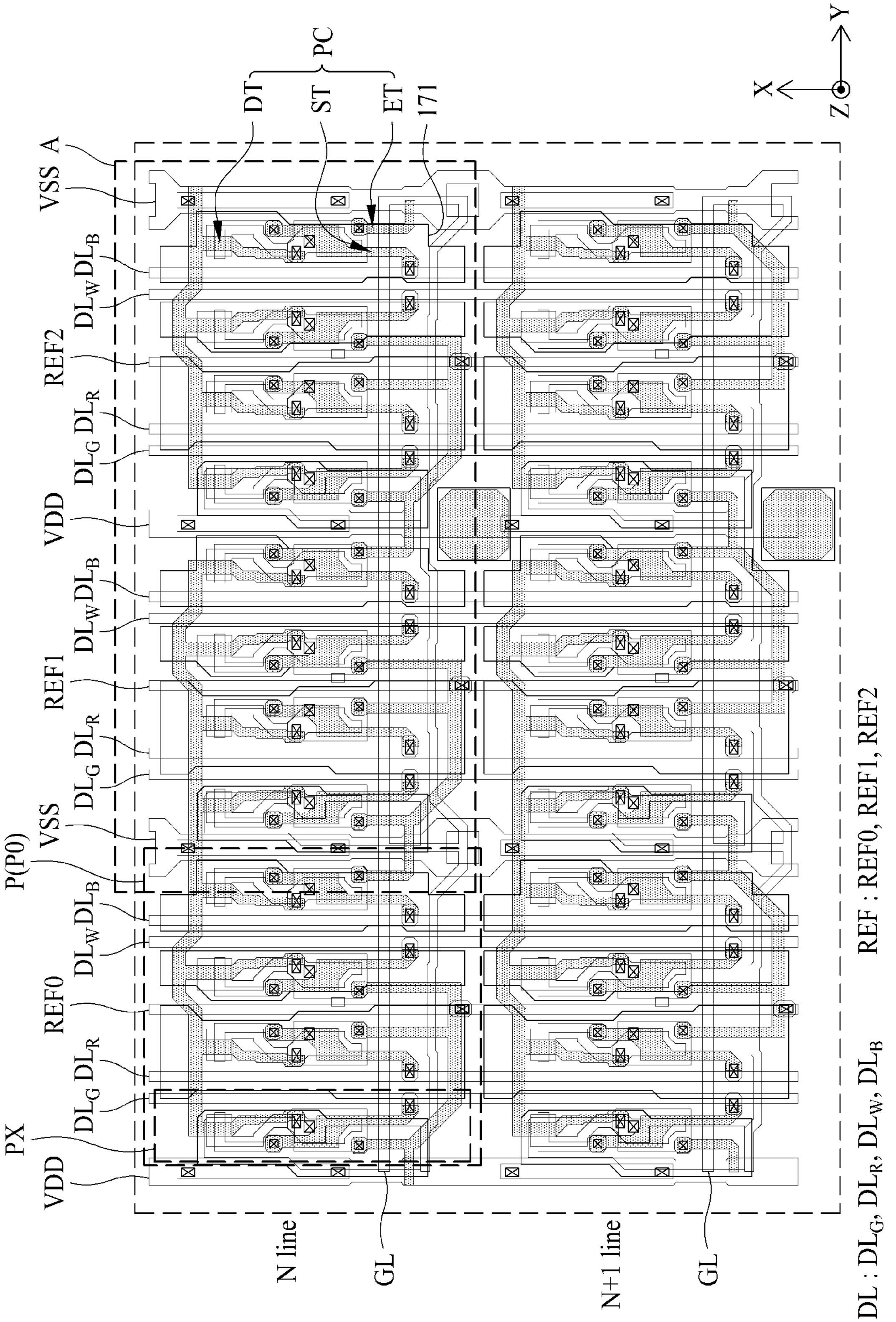
FIG. 3 is a plan view illustrating a structure of a pixel according to an embodiment of the present disclosure.
Figure 4:
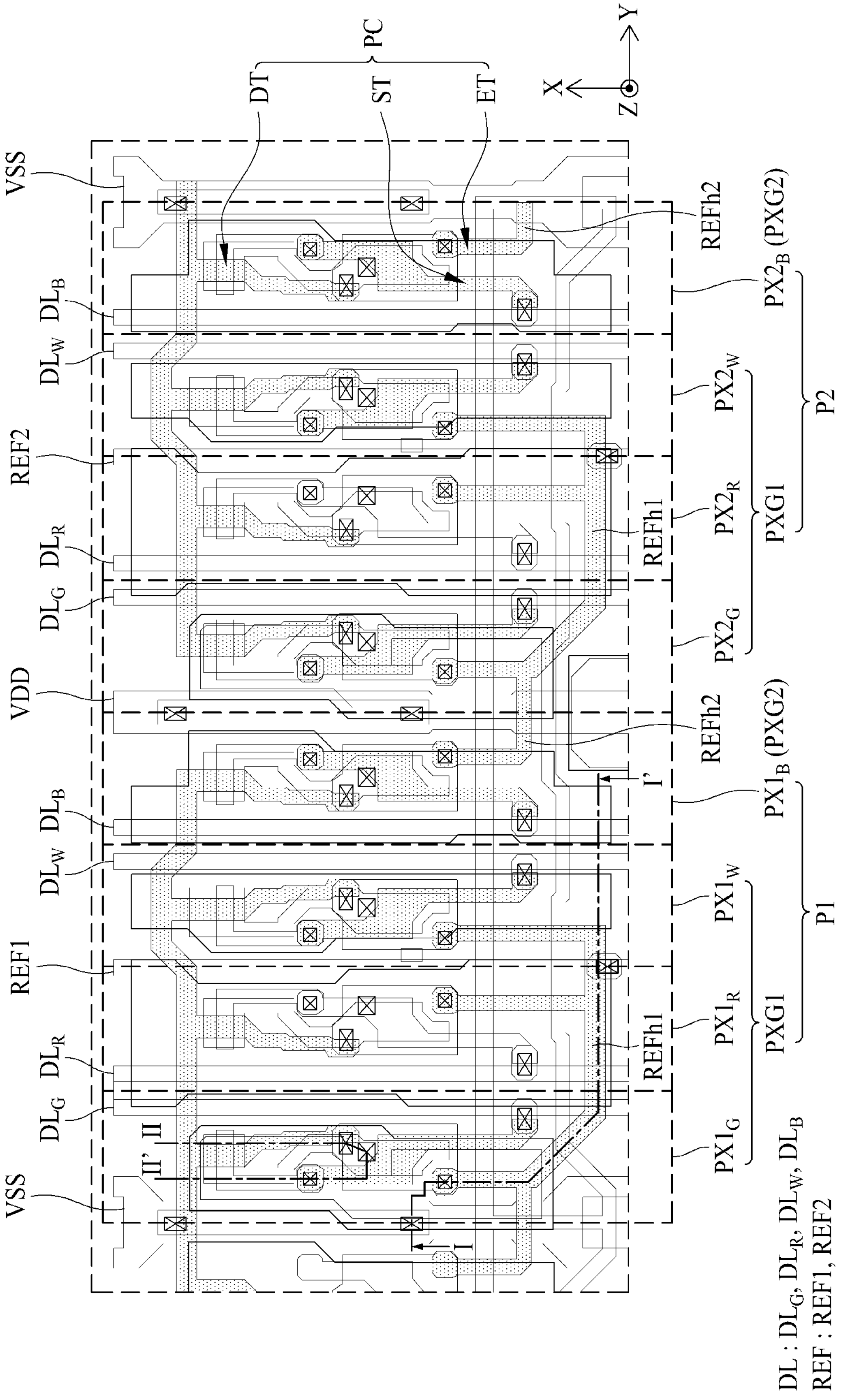
FIG. 4 is an enlarged view illustrating a region A of FIG. 3.

FIG. 3 is a plan view illustrating a structure of a pixel according to an embodiment of the present disclosure. FIG. 4 is an enlarged view illustrating a region A of FIG. 3.

Referring to FIGS. 3 and 4, a light emitting display apparatus according to an embodiment of the present disclosure may include a plurality of pixels P, a plurality of data lines DL, a plurality of reference lines REF, and a plurality of driving power lines VDD and VSS.

Each of the plurality of pixels P may include a plurality of subpixels PX. In the followings. R denotes red, G denotes green, W denotes white, and B denotes blue. Each of the plurality of subpixels PX may be provided in an area defined by or associated with a data line DL and a gate line GL.

Each of the plurality of subpixels PX may include a pixel circuit PC and a light emitting device layer (not shown).

The pixel circuit PC may include a driving TFT DT, a switching TFT ST, a capacitor (not shown), and a sensing TFT ET. The pixel circuit PC may be connected with a data line DL and a reference line REF corresponding to each of the plurality of subpixels PX. For example, a pixel circuit PC of a first subpixel $PX\mathbf{1}_G$ provided in a first pixel P1 may be connected with a data line $DL_G$ corresponding to the first subpixel $PX\mathbf{1}_G$ and a first reference line REF1 corresponding to the first pixel P1. For example, a pixel circuit PC of a second subpixel $PX\mathbf{1}_R$ provided in the first pixel P1 may be connected with a data line $DL_R$ corresponding to the second subpixel $PX\mathbf{1}_R$ and the first reference line REF1 corresponding to the first pixel P1. For example, a pixel circuit PC of a third subpixel $PX\mathbf{1}_W$ provided in the first pixel P1 may be connected with a data line $DL_W$ corresponding to the third subpixel $PX\mathbf{1}_W$ and the first reference line REF1 corresponding to the first pixel P1. For example, a pixel circuit PC of a fourth subpixel $PX\mathbf{1}_B$ provided in the first pixel P1 may be connected with a data line $DL_B$ corresponding to the fourth subpixel $PX\mathbf{1}_B$. In this case, the pixel circuit PC of the fourth subpixel $PX\mathbf{1}_B$ provided in the first pixel P1 may not be connected with the first reference line REF1 corresponding to the first pixel P1 and may be connected with a second reference line REF2 corresponding to a second pixel P2. That is, three subpixels $PX\mathbf{1}_G$, $PX\mathbf{1}_R$, and $PX\mathbf{1}_W$ of the first pixel P1 may be respectively connected with data lines $DL_G$, $DL_R$, and $DL_W$ corresponding thereto and the first reference line REF1, and the other one subpixel $PX\mathbf{1}_B$ may be connected with a corresponding data line $DL_B$ and an adjacent second reference line REF2.

Each of the plurality of pixels P may include a first subpixel group PXG1, a second subpixel group PXG2, a first connection line REFh1, and a second connection line REFh2. For example, the first pixel P1 may include the first subpixel $PX\mathbf{1}_G$, the second subpixel $PX\mathbf{1}_R$, the third subpixel $PX\mathbf{1}_W$, and the fourth subpixel $PX\mathbf{1}_B$. For example, the second pixel P2 may include the first subpixel $PX\mathbf{2}_G$, the second subpixel $PX\mathbf{2}_R$, the third subpixel $PX\mathbf{2}_W$, and the fourth subpixel $PX\mathbf{2}_B$.

Here, the first subpixel group PXG1 may include the first subpixel $PX\mathbf{1}_G$, the second subpixel $PX\mathbf{1}_R$, and the third subpixel $PX\mathbf{1}_W$. The first subpixel group PXG1 may be connected with the first reference line REF1 corresponding to the first pixel P1.

The second subpixel group PXG2 may include the other subpixel except the first subpixel group PXG1. For example, the second subpixel group PXG2 may include the fourth subpixel $PX\mathbf{1}_B$. In this case, the second subpixel group PXG2 may be connected with the second reference line REF2 corresponding to a different pixel (for example, a second pixel) adjacent to the first pixel P1.

The first connection line REFh1 may be connected between the subpixels $PX\mathbf{1}_G$, $PX\mathbf{1}_R$, and $PX\mathbf{1}_W$ of the first subpixel group PXG1 and the first reference line REF1. Accordingly, the first connection line REFh1 may overlap a portion of the data line DL. That is, in the first pixel P1, the first connection line REFh1 may overlap a first data line $DL_G$ and a second data line $DL_R$.

The second connection line REFh2 may be connected between the subpixel $PX\mathbf{1}_B$ of the second subpixel group PXG2 and the second reference line REF2 corresponding to a different pixel (for example, the second pixel P2) adjacent to the subpixel $PX\mathbf{1}_B$. In this case, the second connection line REFh2 may not overlap the data line DL. That is, in the first pixel P1, because the second connection line REFh2 is connected with the second reference line REF2, the second connection line REFh2 may not overlap the data lines $DL_W$ and $DL_B$ provided in the first pixel P1.

In an embodiment of the present disclosure, the second subpixel group PXG2 may be connected with the second reference line REF2 corresponding to a different pixel (for example, the second pixel) adjacent to the first pixel P1, and thus, the second connection line REFh2 may not overlap the data line DL.

Therefore, in an embodiment of the present disclosure, an overlap area between the connection lines REFh1 and REFh2 and the data line DL may be minimized or reduced, and thus, a parasitic capacitance caused by an overlap between lines may decrease. Accordingly, a charge rate and signal delay caused by the parasitic capacitance may be reduced.

For example, in the light emitting display apparatus, the connection lines REFh1 and REFh2 may be configured to intersect with or overlap the data line DL, so as to connect the subpixel PX with the reference line REF. For example, the connection lines REFh1 and REFh2 may intersect with or overlap the data line DL of each subpixel PX, and because a load between lines occurs as an area of an intersection region (or an overlap region) increases, a charge rate of the light emitting display apparatus may decrease and a defect such as ripple may occur, causing a degradation in display quality.

However, in an embodiment of the present disclosure, because the second connection line REFh2 does not overlap the data line DL for each pixel, an overlap area between the connection lines REFh1 and REFh2 and the data line DL may decrease by ½. Therefore, in an embodiment of the present disclosure, because an area where the connection lines REFh1 and REFh2 overlaps the data line DL decreases by ½, signal delay caused by a reduction in load of the data line DL may be reduced, and a charge rate needed for a light emitting display apparatus having a high resolution and a high frequency may be improved. Also, in an embodiment of the present disclosure, a defect such as ripple may be reduced, thereby enhancing the display quality of a light emitting display apparatus.

Moreover, in the light emitting display apparatus according to the present disclosure, as a charge rate is enhanced, power consumption may be reduced, and thus, the light emitting display apparatus may be driven with low power.

For example, in an embodiment of the present disclosure, the second connection line REFh2 may not overlap the data line DL, and thus, one dummy pixel P0 may be provided at each of left and right outermost portions of a display panel.

A light emitting device layer (not shown) may be connected with the pixel circuit PC. The light emitting device layer may be connected with the driving TFT DT and may emit light, based on a data signal supplied from the driving TFT DT. The light emitting device layer may include an anode 171, an emission layer, and a cathode.

Each of the plurality of data lines DL may extend in a first direction (for example, an X-axis direction) of a substrate. Each of the plurality of data lines DL may be arranged in parallel with a second direction (for example, a Y-axis direction) vertical to the first direction. A data voltage Vdata may be applied to the plurality of data lines DL in response to a gate-on signal from the gate line GL.

To this end, the plurality of data lines DL may be respectively connected with the plurality of subpixels PX. For example, the first data line $DL_G$ of a plurality of data lines DL provided in the first pixel P1 may be connected with the first subpixel $PX1_G$, the second data line $DL_R$ may be connected with the second subpixel $PX1_R$, the third data line $DL_W$ may be connected with the third subpixel $PX1_W$, and the fourth data line $DL_B$ may be connected with the fourth subpixel $PX1_B$.

Each of the plurality of reference lines REF may extend in the first direction (for example, the X-axis direction) of the substrate. Each of the plurality of reference lines REF may be arranged in parallel with the second direction (for example, the Y-axis direction) vertical to the first direction. A plurality of reference lines REF may be provided in each of the plurality of pixels P. That is, one reference line REF may be provided in one pixel P. For example, a dummy reference line REF0 may be provided in the dummy pixel P0, the first reference line REF1 may be provided in the first pixel P1, and the second reference line REF2 may be provided in the second pixel P2.

In one pixel P, one reference line REF may be disposed between data lines DL. For example, in the first pixel P1, the first reference line REF1 may be provided between the first and second data lines $DL_G$ and $DL_R$ and third and fourth data lines $DL_W$ and $DL_B$. That is, two data lines DL may be provided at each of both sides of the first reference line REF1.

Each of the plurality of reference lines REF may transfer an initialization voltage (or a sensing voltage) to a sensing TFT ET of a corresponding pixel P. For example, each of the plurality of reference lines REF may be connected with a sensing node of a corresponding pixel P. The plurality of reference lines REF may be formed simultaneously by using the same process as the plurality of data lines DL and may include the same material.

One reference line REF corresponding to one pixel P according to an embodiment of the present disclosure may be connected with a first subpixel group PXG1 of one pixel P and a second subpixel group PXG2 of an adjacent pixel P. For example, a first reference line REF1 corresponding to the first pixel P1 may be connected with the first subpixel group PXG1 of the first pixel P1 and a second subpixel group PXG2 of an adjacent dummy pixel P0. For example, a second reference line REF2 corresponding to the second pixel P2 may be connected with the first subpixel group PXG1 of the second pixel P2 and a second subpixel group PXG2 of an adjacent first pixel P1. Therefore, the second connection line REFh2 may not overlap the data line DL.

For example, a second connection line REFh2 provided in a first line (N line) may not overlap the third data line $DL_W$ and the fourth data line $DL_B$. In this case, a second connection line REFh2 provided in a second line (N+1 line) may not overlap the first data line $DL_G$ and the second data line $DL_R$.

Therefore, in an embodiment of the present disclosure, an overlap area between the second connection line REFh2 and the data line DL may be minimized or reduced for each pixel P. and thus, a reduction in charge rate and signal delay caused by a parasitic capacitance may be reduced. That is, in an embodiment of the present disclosure, the first connection line REFh1 may overlap two data lines DL for each pixel P and the second connection line REFh2 may not overlap two data lines DL, and thus, an overlap area between the connection line REFh and the data line DL for each pixel may decrease by ½. Therefore, a parasitic capacitance caused by an overlap between lines may decrease by ½, and signal delay and a reduction in charge rate may be reduced. Accordingly, the display quality of a light emitting display apparatus may be enhanced.

The plurality of driving power lines VDD and VSS may be provided for each of the plurality of pixels P. The reference line REF and the data line DL may be arranged in parallel between the plurality of driving power lines VDD and VSS. In this case, the second connection line REFh2 may overlap one of driving power lines and may be connected with a reference line REF of an adjacent pixel P. The plurality of driving power lines VDD and VSS may include a first driving power line VDD and a second driving power line VSS. For example, the first driving power line VDD may be provided at one side of one pixel P. and the second driving power line VSS may be provided at the other side of one pixel P. The first driving power line VDD may transfer a high level source voltage to a source electrode or a drain electrode of a TFT 130. The second driving power line VSS may transfer a low level source voltage to a cathode electrode of the light emitting device layer EL. The plurality of driving power lines VDD and VSS may be formed simultaneously by using the same process as the plurality of data lines DL and may include the same material.

Figure 5:
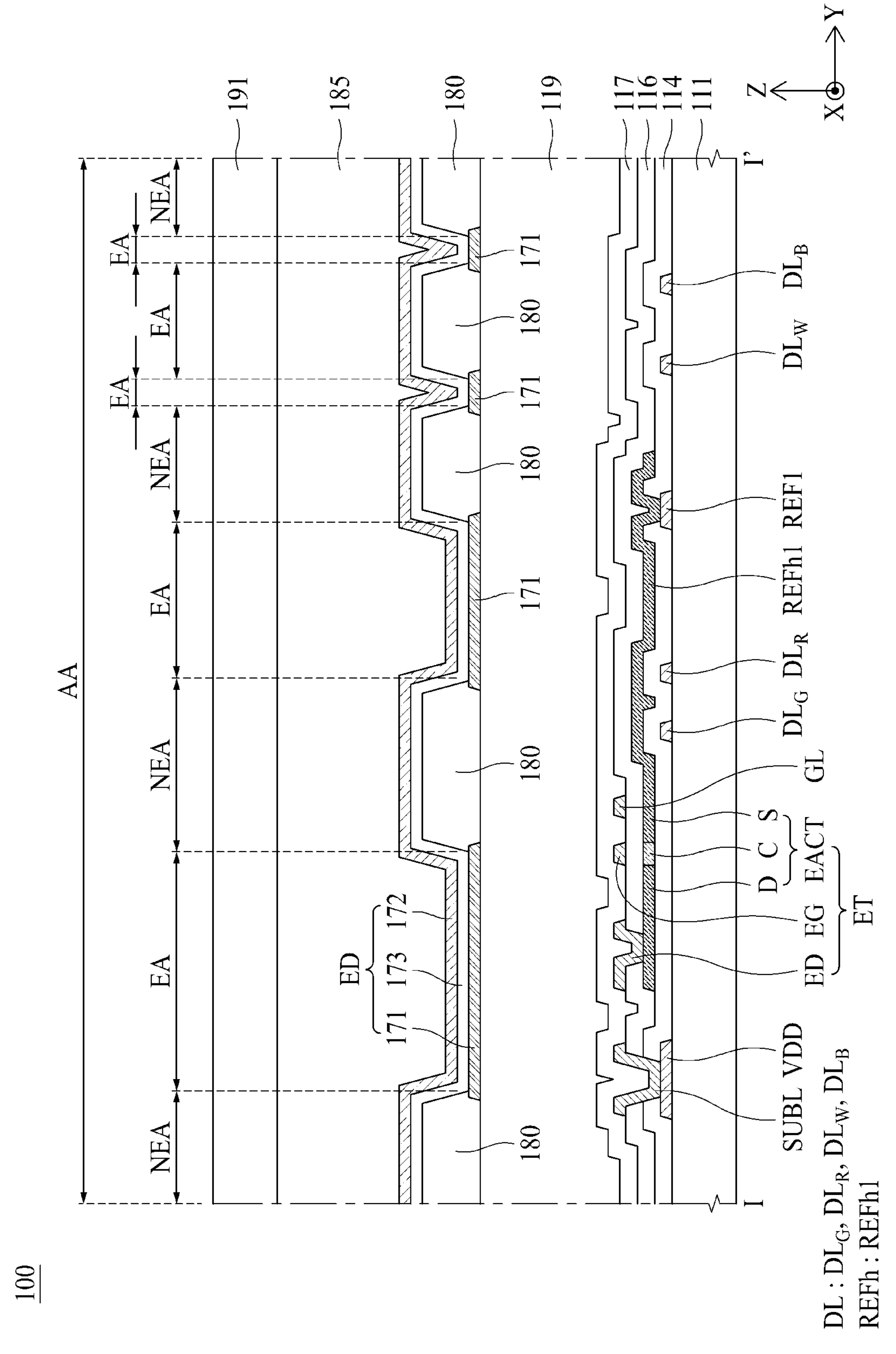
FIG. 5 is a cross-sectional view illustrating a cross-sectional surface taken along line I-I' of FIG. 4.

FIG. 5 is a cross-sectional view illustrating a cross-sectional surface taken along line I-I' of FIG. 4. FIG. 5 is a cross-sectional view illustrating a cross-sectional surface of a portion where a sensing TFT, a reference line, and a first connection line are provided.

Referring to FIG. 5, a light emitting display apparatus according to an embodiment of the present disclosure may include a lower substrate 111, a plurality of data lines DL, a first reference line REF1, a driving power line VDD, a buffer layer 114, a sensing TFT ET, a first connection line REFh1, a gate line GL, a lower insulation layer 116, an upper insulation layer 117, an overcoat layer 119, a light emitting device layer ED, a bank 180, an encapsulation layer 185, and an upper substrate 191.

The lower substrate 111 may include a display area AA and a non-display area at a periphery of the display area AA. The display area AA may include a plurality of subpixels each including an emission region EA and a non-emission region NA. The non-display area may be a pad area.

The lower substrate 111 may include a glass material, but is not limited thereto and may include a transparent plastic material (for example, a polyimide material) capable of being curved or bent. In a case where a plastic material is used as a material of the lower substrate 111, polyimide which is excellent in heat resistance for enduring a high temperature may be used based on that a high temperature deposition process is performed on the lower substrate 111.

The plurality of data lines DL may be provided between the lower substrate 111 and the buffer layer 114. The plurality of data lines DL may transfer a data voltage Vdata, supplied through each of the plurality of data lines DL, to a TFT. Data lines $DL_G$ and $DL_R$, provided at one side of the first reference line REF1, of the plurality of data lines DL may overlap a first connection line REFh1, and data lines $DL_W$ and $DL_B$ provided at the other side of the first reference line REF1 may not overlap the first connection line REFh1. That is, a first data line $DL_G$ and a second data line $DL_R$ of the plurality of data lines DL may overlap the first connection line REFh1, and a third data line $DL_W$ and a fourth data line $DL_B$ of the plurality of data lines DL may not overlap the first connection line REFh1.

Therefore, in an embodiment of the present disclosure, an overlap area between the connection line REFh and the data line DL may decrease by ½. Accordingly, in an embodiment of the present disclosure, an overlap area between the connection line REFh and the data line DL may be minimized or reduced, and thus, a reduction in charge rate and signal delay caused by a parasitic capacitance may be reduced.

The first reference line REF1 may be provided between the lower substrate 111 and the buffer layer 114. The first reference line REF1 may transfer a reference voltage Vref, supplied through the first reference line REF1, to the sensing TFT ET. The first reference line REF1 may be provided between the plurality of data lines DL. For example, the first reference line REF1 may be provided between first and second data lines $DL_G$ and $DL_R$ and third and fourth data lines $DL_W$ and $DL_B$. For example, the first reference line REF1 may be formed simultaneously by using the same process as the plurality of data lines DL and may include the same conductive material.

The driving power line VDD may be provided between the lower substrate 111 and the buffer layer 114. The driving power line VDD may transfer a high level source voltage to a TFT. The driving power line VDD may be formed simultaneously by using the same process as the plurality of data lines DL and may include the same conductive material.

The buffer layer 114 may be provided on the lower substrate 111. The buffer layer 114 may be provided on the plurality of data lines DL, the first reference line REF1, and the driving power line VDD. The buffer layer 114 may block the diffusion of a material of the lower substrate 111 to a transistor layer in performing a high temperature process in a manufacturing process of a TFT. Also, the buffer layer 114 may prevent external water or moisture from penetrating into a light emitting device. For example, the buffer layer 114 may include silicon oxide or silicon nitride. For example, the buffer layer 114 may include silicon oxide, silicon nitride, or a structure where silicon oxide and silicon nitride are alternately stacked.

The sensing TFT ET may be provided on the buffer layer 114. The sensing TFT ET may include a sensing active layer EACT, a sensing gate electrode EG, and a drain electrode ED.

The sensing active layer EACT may be provided on the buffer layer 114. The sensing active layer EACT may include a channel region C and a source/drain region S/D provided at each of both sides of the channel region C. That is, the sensing active layer EACT may include the source/drain region S/D, which has conductivity based on an impurity doping process, and the channel region C which does not have conductivity. In this case, the source/drain regions S/D may be disposed apart from each other in parallel with the channel region C therebetween. For example, the sensing active layer EACT may include a semiconductor material consisting of one of amorphous silicon, polycrystalline silicon, oxide, and an organic material.

The lower insulation layer 116 may be provided on the sensing active layer EACT. For example, the lower insulation layer 116 may include an inorganic material such as silicon oxide (SiOx) or silicon nitride (SiNx).

The sensing gate electrode EG may be provided on the lower insulation layer 116 to overlap the channel region C of the sensing active layer EACT. The sensing gate electrode EG may function as a mask which allows the channel region C of the sensing active layer EACT not to have conductivity in an ion doping process. For example, the sensing gate electrode EG may include molybdenum (Mo), aluminum (Al), chromium (Cr), gold (Au), titanium (Ti), nickel (Ni), neodymium (Nd), copper (Cu), or an alloy thereof and may include a single layer or a two or more-layer multilayer, which includes the metal or alloy.

The drain electrode ED may be provided on the buffer layer 114. The drain electrode ED may be connected with the drain region D of the sensing active layer EACT. For example, the drain electrode ED may be formed simultaneously by using the same process as the sensing gate electrode EG and may include the same conductive material.

The first connection line REFh1 may be provided on the buffer layer 114. The first connection line REFh1 may extend from the sensing active layer EACT. The first connection line REFh1 may be provided on the same layer as that sensing active layer EACT. The first connection line REFh1 may be connected with a corresponding first reference line REF1 by using a contact hole. For example, the first connection line REFh1 may overlap a portion of the data line DL. That is, the first connection line REFh1 may overlap the first and second data lines $DL_G$ and $DL_R$ and may not overlap the third and fourth data lines $DL_W$ and $DL_B$.

For example, in a light emitting display apparatus of the related art, the connection line REFh connected with the first connection line REFh1 may overlap all of data lines DL disposed at both sides so as to be connected with each subpixel. That is, the connection line REFh may be formed across all data lines DL. Accordingly, in the related art, a reduction in charge rate and signal delay caused by an overlap between lines may occur.

However, in an embodiment of the present disclosure, the first connection line REFh1 may partially overlap the data line DL, and thus, an overlap area between lines may decrease by ½. Accordingly, in an embodiment of the present disclosure, a parasitic capacitance caused by an overlap between lines may decrease by ½, and thus, signal delay and a reduction in charge rate may be reduced.

The gate line GL may be provided on the lower insulation layer 116. The gate line GL may be provided on the same layer as the gate line GL. The gate line GL may be formed simultaneously by using the same process as the sensing gate electrode EG and may include the same conductive material.

Furthermore, the light emitting display apparatus according to an embodiment of the present disclosure may further include a secondary line SUBL provided on the driving voltage line VDD. The secondary line SUBL may be connected with the driving voltage line VDD with the buffer layer 114 and the lower insulation layer 116 therebetween. The secondary line SUBL may be connected with the driving voltage line VDD and may decrease a resistance of the driving voltage line VDD.

The upper insulation layer 117 may be configured to cover the plurality of data lines DL, the first reference line REF1, the driving power line VDD, the sensing TFT ET, the first connection line REFh1, and the gate line GL. The upper insulation layer 117 may protect the plurality of data lines DL, the first reference line REF1, the driving power line VDD, the sensing TFT ET, the first connection line REFh1, and the gate line GL. For example, the upper insulation layer 117 may include an inorganic material such as SiOx or SiNx.

The overcoat layer 119 may be provided on the lower substrate 111. The overcoat layer 119 may be provided on the upper insulation layer 117. The overcoat layer 119 may be configured to cover the plurality of data lines DL, the first reference line REF1, the driving power line VDD, the sensing TFT ET, the first connection line REFh1, and the gate line GL.

The light emitting device layer ED may be provided on the overcoat layer 119. The light emitting device layer ED may include a first electrode 171, an emission layer 173, and a second electrode 172.

The first electrode 171 may be provided on the overcoat layer 119. The first electrode 171 may be formed in a multi-layer structure which includes a transparent conductive layer and an opaque conductive layer having high reflection efficiency. The transparent conductive layer may include a material, having a relatively large work function value, such as indium-tin-oxide (ITO) or indium-zinc-oxide (IZO), and the opaque conductive layer may include a single-layer or multi-layer structure which includes Al, silver (Ag), Cu, lead (Pb), Mo, Ti, or an alloy thereof.

The bank 180 may be a pixel definition layer which defines or is adjacent to an emission region of each subpixel. For example, the bank 180 may include an opaque material so as to prevent light interference between adjacent subpixels. In this case, the bank 180 may include a light blocking material including at least one of a colored pigment, organic black, and carbon.

The emission layer 173 may be provided on the first electrode 171. The emission layer 173 may be formed by stacking a hole injection/transport layer, an organic emission layer, and an electron injection/transport layer in order or in reverse order.

The second electrode 172 may be opposite to the first electrode 171 with the emission layer 173 therebetween and may be provided on an upper surface and a lateral surface of the emission layer 173. The second electrode 172 may be provided as one body in a whole surface of an active region. For example, in a case where the second electrode 172 is applied to an organic light emitting display apparatus of a top emission type, the second electrode 172 may include a transparent conductive layer such as ITO or IZO.

The encapsulation layer 185 may be provided between the lower substrate 111 and the upper substrate 191. The encapsulation layer 185 may prevent water and oxygen from penetrating into a display panel.

The upper substrate 191 may be provided to be opposite to the lower substrate 111. The upper substrate 191 may include a glass material, but is not limited thereto and may include a transparent plastic material (for example, a polyimide material) capable of being curved or bent. In a case where a plastic material is used as a material of the upper substrate 191, polyimide which is excellent in heat resistance for enduring a high temperature may be used based on that a high temperature deposition process is performed on the upper substrate 191.

Furthermore, the upper substrate 191 may further include a color filter layer and a black matrix. The color filter layer may be provided in each subpixel of the upper substrate 191. For example, the color filter layer may include a green color filter, a red color filter, and a blue color filter respectively corresponding to subpixels. The black matrix may be provided at a boundary between adjacent subpixels. The black matrix may be provided between color filters so that lights passing through color filters do not overlap each other or are not mixed. The black matrix may divide or isolate an emission region of light passing through the color filter layer.

In the following description, only modified elements will be described in detail, and the other elements are referred to by the same reference numerals as FIG. 5 and repeated descriptions thereof are omitted and will be briefly given.

Figure 6:
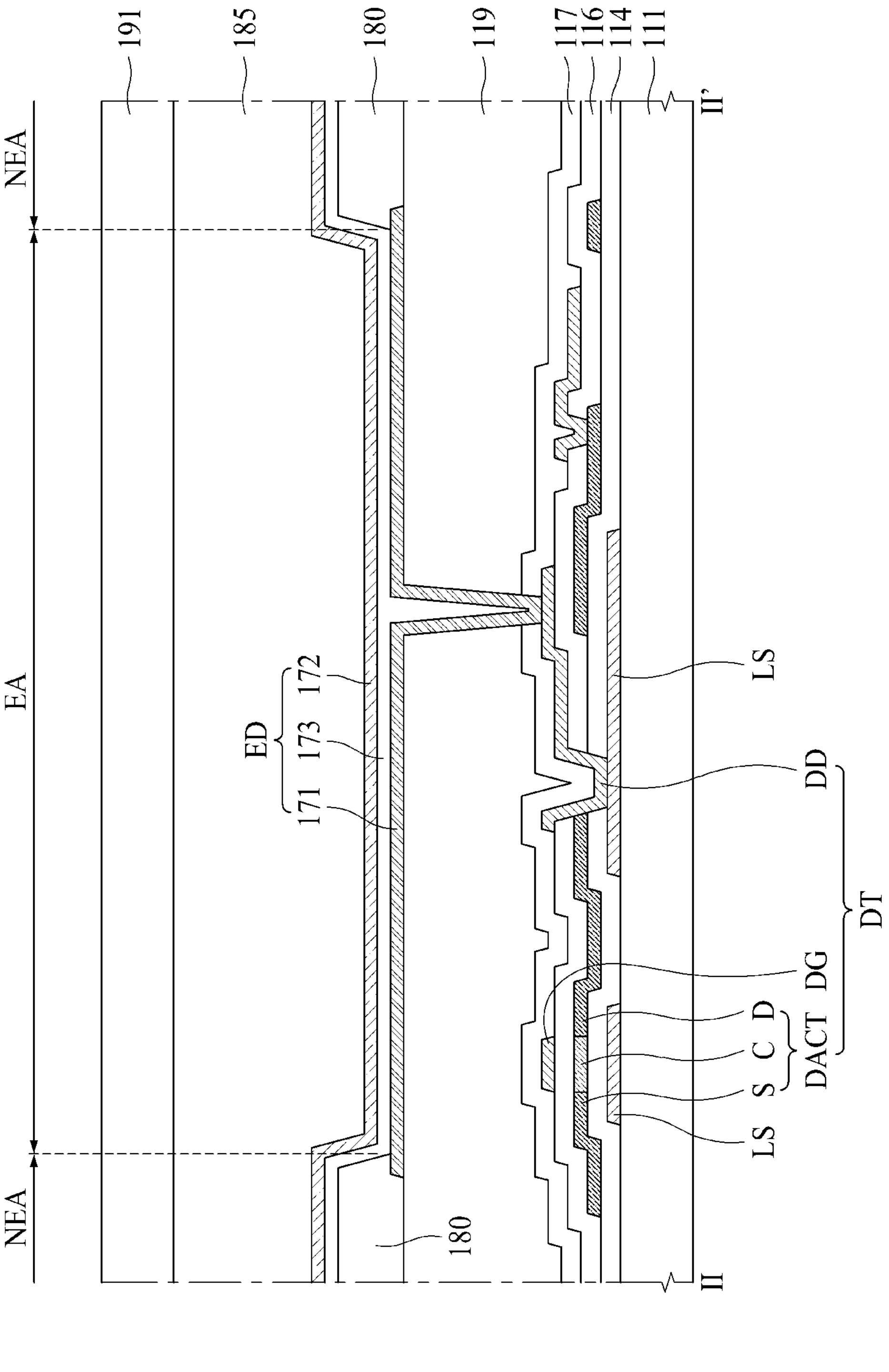
FIG. 6 is a cross-sectional view illustrating a cross-sectional surface taken along line II-II' of FIG. 4.

FIG. 6 is a cross-sectional view illustrating a cross-sectional surface taken along line II-II' of FIG. 4.

Referring to FIG. 6, a light emitting display apparatus according to an embodiment of the present disclosure may include a light blocking layer LS and a driving TFT DT.

The light blocking layer LS may be provided between a lower substrate 111 and a driving active layer DACT. The light blocking layer LS may block light which is incident toward the driving active layer DACT through the lower substrate 111, and thus, may minimize, reduce or prevent a threshold voltage variation of a transistor caused by external light. Optionally, the light blocking layer LS may be electrically connected with a drain node of a transistor and may function as a lower gate electrode of a corresponding transistor, and in this case, may minimize, reduce or prevent a variation of characteristic caused by light and a threshold voltage variation of a transistor based on a bias voltage.

The driving TFT DT may be provided on the light blocking layer LS with the buffer layer 114 therebetween. The driving TFT DT may include the driving active layer DACT, a driving gate electrode DG, and a driving drain electrode DD.

The driving active layer DACT may be provided on the buffer layer 114. The driving active layer DACT may include a channel region C and a source/drain region S/D provided at each of both sides of the channel region C. That is, the driving active layer DACT may include the source/drain region S/D, which has conductivity based on an impurity implanting process, and the channel region C which does not have conductivity. In this case, the source/drain regions S/D may be disposed apart from each other in parallel with the channel region C therebetween.

The driving gate electrode DG may be provided on the lower insulation layer 116 to overlap the channel region C of the driving active layer DACT. The driving gate electrode DG may function as a mask which allows the channel region C of the driving active layer DACT not to have conductivity in an ion implanting process.

The driving drain electrode DD may be provided on the same layer as the driving gate electrode DG. The driving drain electrode DD may be connected with the source/drain region S/D which has conductivity based on an impurity implanting process. The driving drain electrode DD may contact the light blocking layer LS which is provided between the buffer layer 114 and the lower insulation layer 116. The driving drain electrode DD may be connected with a first electrode 171 of a light emitting device layer ED through a contact hole.

Figure 7:
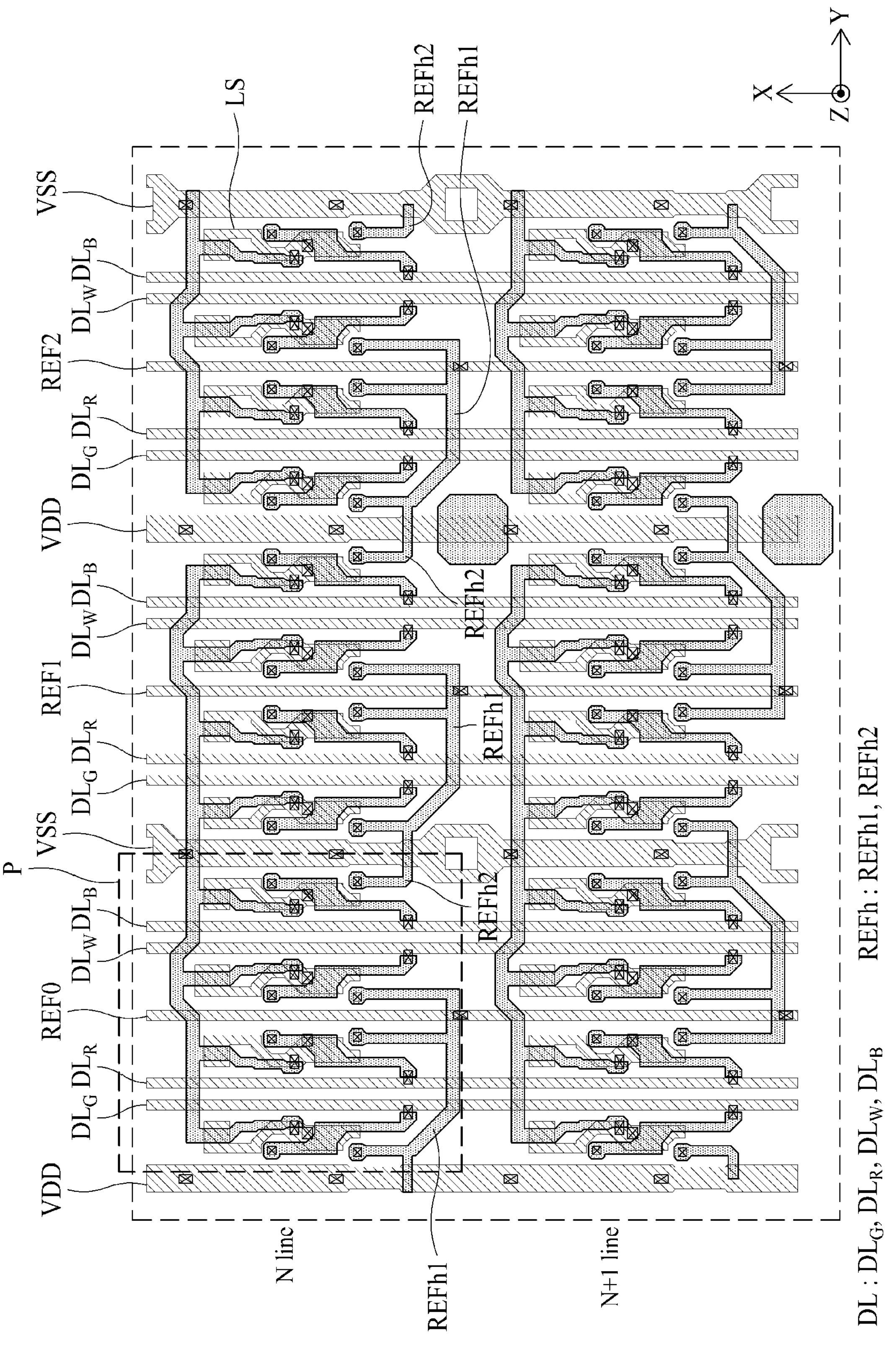
FIG. 7 is a plan view illustrating a data line, a reference line, an active layer, and a connection line of FIG. 3.

FIG. 7 is a plan view illustrating a data line, a reference line, an active layer, and a connection line of FIG. 3. FIG.

Figure 9:
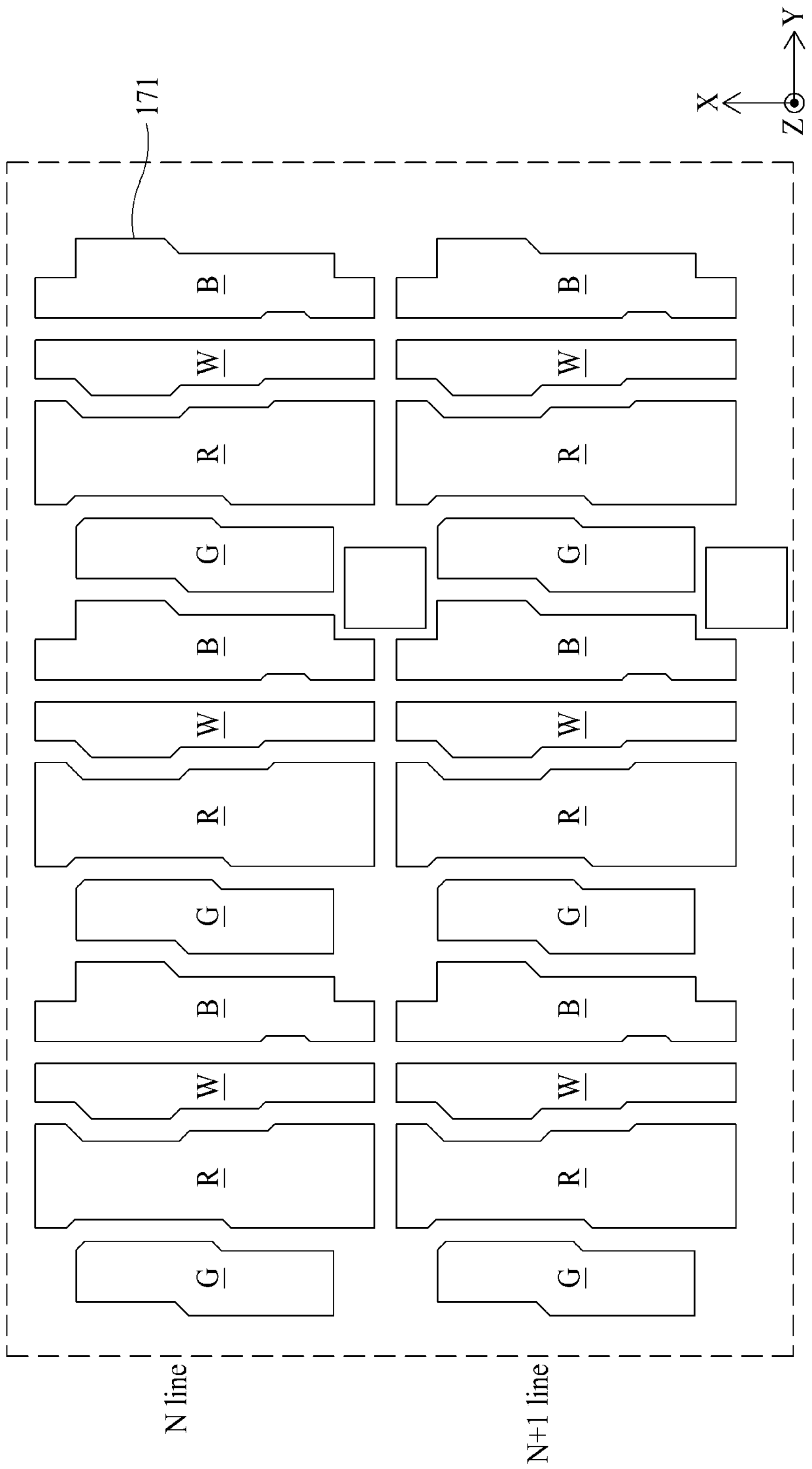
FIG. 9 is a plan view illustrating an anode electrode of FIG. 3.

8 is a plan view illustrating a gate line and a gate electrode of FIG. 3. FIG. 9 is a plan view illustrating an anode electrode of FIG. 3.

Figure 8:
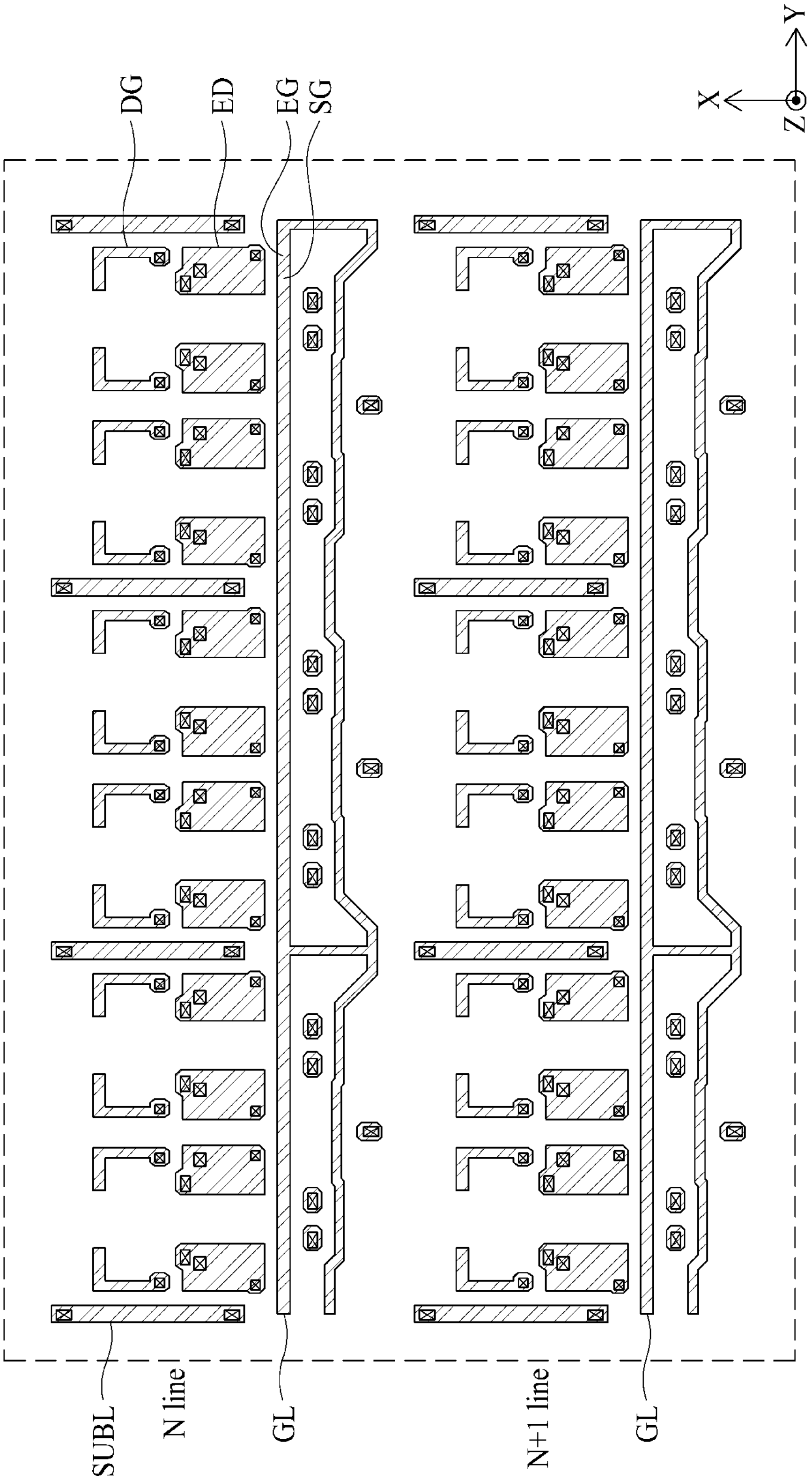
FIG. 8 is a plan view illustrating a gate line and a gate electrode of FIG. 3.

Referring to FIGS. 7 to 9, a light emitting display apparatus according to an embodiment of the present disclosure may include a plurality of pixels P. The plurality of pixels P may be arranged in parallel in an X-axis direction and a Y-axis direction. Each of the plurality of pixels P may include a first connection line REFh1 and a second connection line REFh2. In this case, the first connection line REFh1 of each of the plurality of pixels P arranged in parallel in the X-axis direction may overlap different data lines DL.

For example, a first connection line REFh1 provided in a first line (N line) may be connected with a first reference line REF1 and may overlap a first data line $DL_G$ and a second data line $DL_R$. In this case, the first connection line REFh1 provided in the first line (N line) may not overlap a third data line $DL_W$ and a fourth data line $DL_B$. Also, a second connection line REFh2 provided in the first line (N line) may not overlap the third data line $DL_W$ and the fourth data line $DL_B$.

For example, a first connection line REFh1 provided in a second line (N+1 line) may be connected with the first reference line REF1 and may overlap the third data line $DL_W$ and the fourth data line $DL_B$. In this case, the first connection line REFh1 provided in the second line (N+1 line) may not overlap the first data line $DL_G$ and the second data line $DL_R$. Also, a second connection line REFh2 provided in the second line (N+1 line) may not overlap the first data line $DL_G$ and the second data line $DL_R$.

A gate line GL and gate electrodes EG, DG, and SG may be arranged in the first line (N line) and the second line (N+1 line). The gate line GL and the gate electrodes EG, DG, and SG may have the same shape in the first line (N line) and the second line (N+1 line).

First electrodes 171 may have different shapes for each subpixel. The first electrodes 171 may be arranged in the first line (N line) and the second line (N+1 line). The first electrodes 171 may have the same shape in the first line (N line) and the second line (N+1 line).

Figure 10:
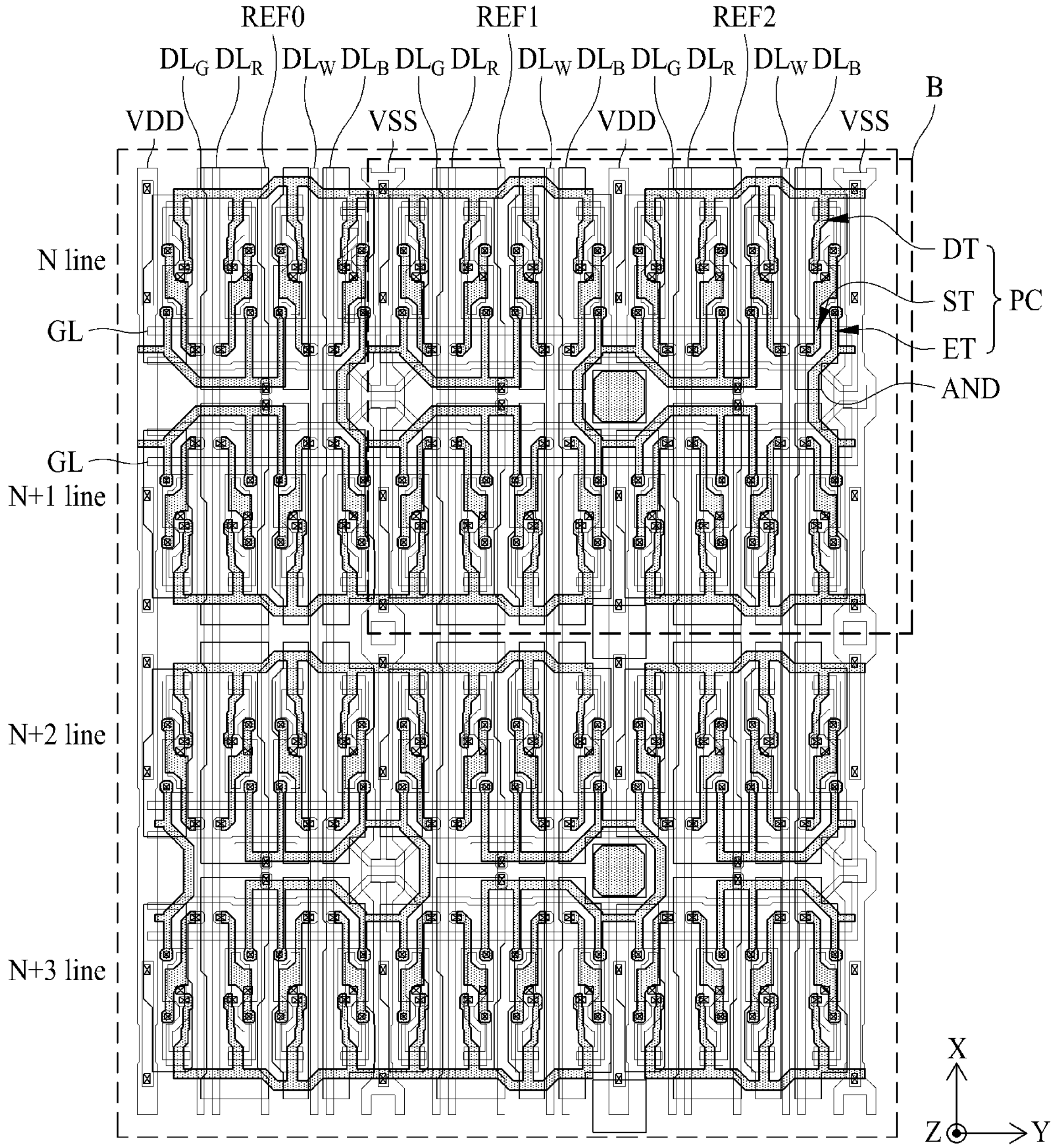
FIG. 10 is a plan view illustrating a structure of a pixel according to another embodiment of the present disclosure.
Figure 11:
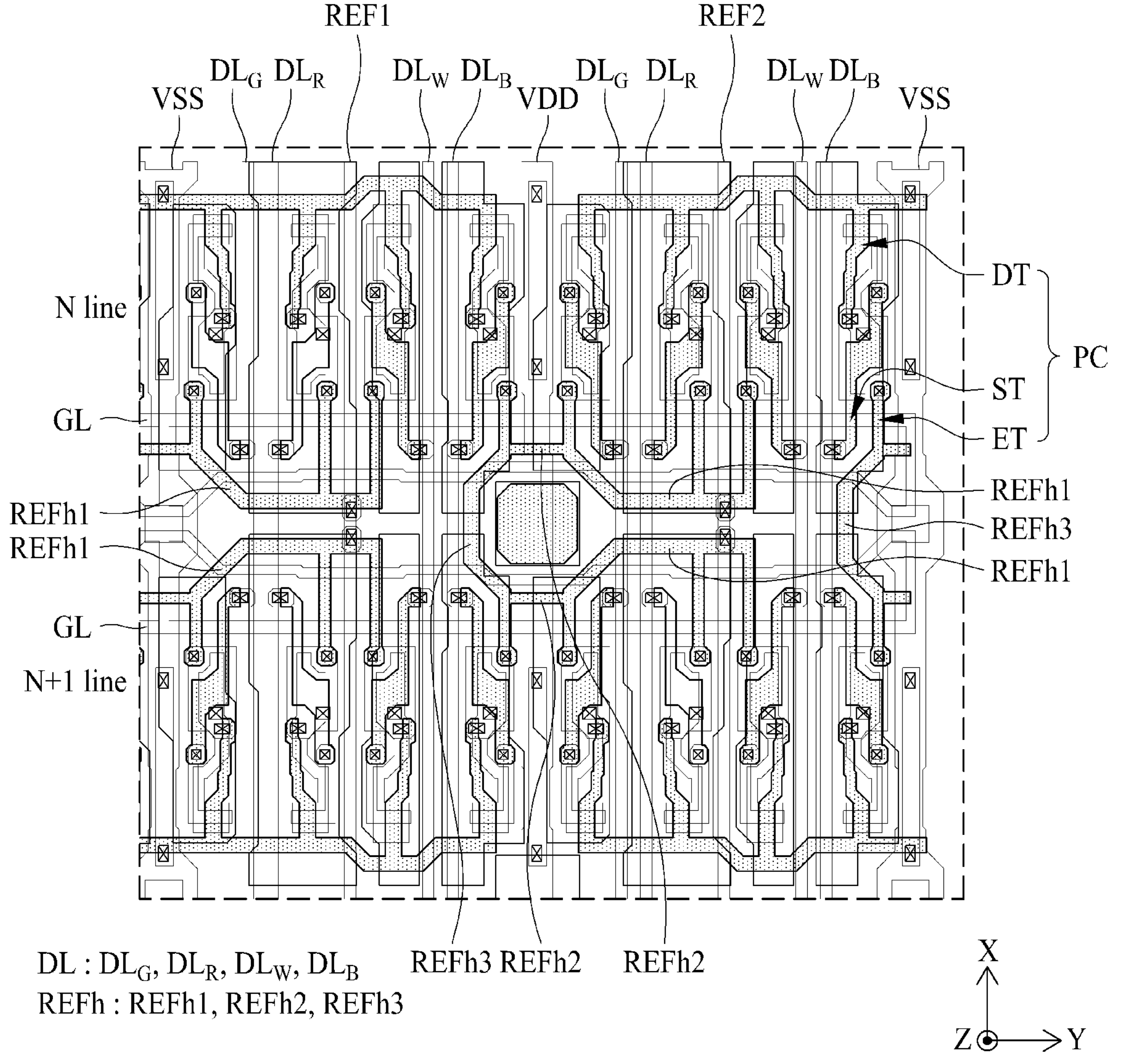
FIG. 11 is an enlarged view illustrating a region B of FIG. 10.

FIG. 10 is a plan view illustrating a structure of a pixel according to another embodiment of the present disclosure. FIG. 11 is an enlarged view illustrating a region B of FIG. 10. Except for that the arrangement of connection lines is partially modified for each pixel and a third connection line is additionally provided, another embodiment of the present disclosure may be the same as an embodiment of the present disclosure. Hereinafter, therefore, only different elements will be described.

Referring to FIGS. 10 and 11, a light emitting display apparatus according to another embodiment of the present disclosure may further include a third connection line REFh3. The third connection line REFh3 may be provided vertically in a first direction (for example, an X-axis direction). The third connection line REFh3 may be provided between driving power lines VDD and VSS and a data line DL. The third connection line REFh3 may not overlap the data line DL.

For example, in a first line (N line) and a second line (N+1 line), the third connection line REFh3 may be provided between the driving power lines VDD and VSS and a fourth data line $DL_B$. For example, in a third line (N+2 line) and a fourth line (N+3 line), the third connection line REFh3 may be provided between the driving power lines VDD and VSS and a first data line $DL_G$.

The third connection line REFh3 may connect two adjacent second connection lines REFh2 with each other in the first direction (for example, the X-axis direction). For example, the third connection line REFh3 may connect a second connection line REFh2, connected with a subpixel PX1 of the first line (N line), with a second connection line REFh2 connected with a subpixel PX1 of the second line (N+1 line). For example, the third connection line REFh3 may connect a second connection line REFh2, connected with a subpixel PX1 of the third line (N+2 line), with a second connection line REFh2 connected with a subpixel PX1 of a fourth line (N+3 line).

Accordingly, first connection lines REFh1 arranged vertically with a third connection line REFh3 therebetween may be symmetrical with one another, and second connection lines REFh2 arranged vertically with the third connection line REFh3 therebetween may be symmetrical with one another.

In another embodiment of the present disclosure, a third connection line REFh2 may be configured to connect two second connection lines REFh2, arranged in parallel in the first direction, with each other and not to overlap data lines DL, and thus, an overlap area between a connection line REFh and a data line DL may be minimized or reduced. Accordingly, a parasitic capacitance caused by an overlap between lines may be reduced, and signal delay and a reduction in charge rate caused by the parasitic capacitance may be reduced.

Figure 12:
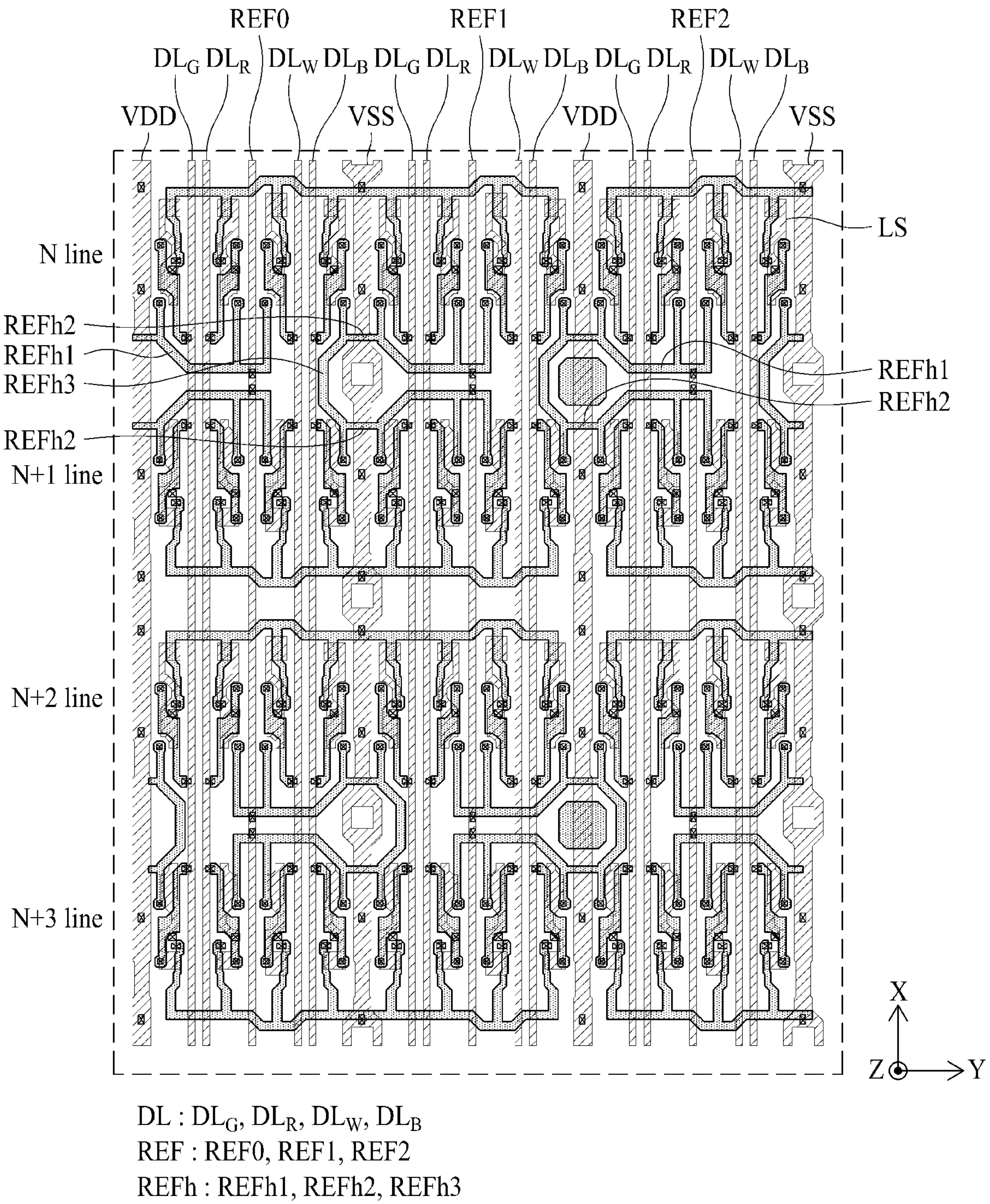
FIG. 12 is a plan view illustrating a data line, a reference line, an active layer, and a connection line of FIG. 10.
Figure 13:
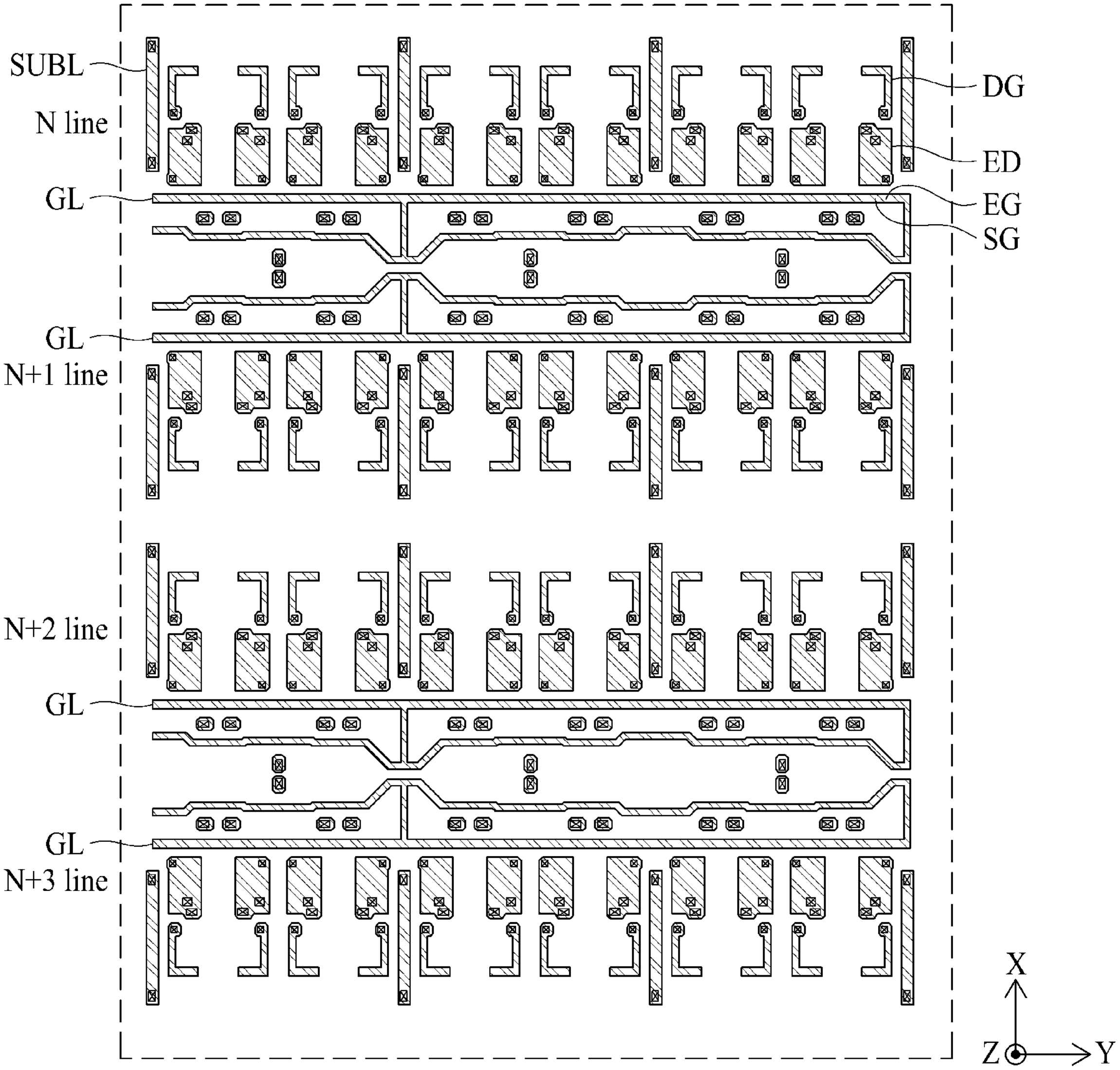
FIG. 13 is a plan view illustrating a gate line and a gate electrode of FIG. 10.

FIG. 12 is a plan view illustrating a data line, a reference line, an active layer, and a connection line of FIG. 10. FIG. 13 is a plan view illustrating a gate line and a gate electrode of FIG. 10.

Referring to FIGS. 12 and 13, a light emitting display apparatus according to another embodiment of the present disclosure may include a plurality of pixels P. The plurality of pixels P may be arranged in parallel in an X-axis direction and a Y-axis direction. Each of the plurality of pixels P may include a third connection line REFh3. In this case, a first connection line REFh1 of each of the plurality of pixels P arranged in parallel in the X-axis direction may overlap different data lines DL by two line units.

For example, a first connection line REFh1 provided in a first line (N line) and a second line (N+1 line) may be connected with a first reference line REF1 and may overlap a first data line $DL_G$ and a second data line $DL_R$. In this case, the first connection line REFh1 provided in the first line (N line) and the second line (N+1 line) may not overlap a third data line $DL_W$ and a fourth data line $DL_B$. Also, a second connection line REFh2 provided in the first line (N line) and the second line (N+1 line) may not overlap the third data line $DL_W$ and the fourth data line $DL_B$. Also, a third connection line REFh3 provided in the first line (N line) and the second line (N+1 line) may be disposed between driving power lines VDD and VSS and a fourth data line $DL_B$ and may not overlap the third data line $DL_W$ and the fourth data line $DL_B$.

For example, a first connection line REFh1 provided in a third line (N+2 line) and a fourth line (N+3 line) may be connected with the first reference line REF1 and may overlap the third data line $DL_W$ and the fourth data line $DL_B$. In this case, the first connection line REFh1 provided in the third line (N+2 line) and the fourth line (N+3 line) may not overlap the first data line $DL_G$ and the second data line $DL_R$. Also, a second connection line REFh2 provided in provided in the third line (N+2 line) and the fourth line (N+3 line) may not overlap the first data line $DL_G$ and the second data line $DL_R$. Also, a third connection line REFh3 provided in the third line (N+2 line) and the fourth line (N+3 line) may be disposed between the driving power lines VDD and VSS and the first data line $DL_G$ and may not overlap the first data line $DL_G$ and the second data line $DL_R$.

A gate line GL and gate electrodes EG, DG, and SG may be arranged identically by two line units. That is, the first line (N line) and the third line (N+2 line) may be arranged identically, and the second line (N+1 line) and the fourth line (N+3 line) may be arranged identically. Accordingly, in the gate line GL and the gate electrodes EG, DG, and SG, the first line (N line) and the third line (N+2 line) may be symmetrical with each other, and the second line (N+1 line) and the fourth line (N+3 line) may be symmetrical with each other.

A light emitting display apparatus according to the present disclosure may be applied to all electronic devices including a light emitting display panel and a gate driving circuit unit embedded in the light emitting display panel. For example, the light emitting display apparatus according to the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, televisions (TVs), wall paper display apparatuses, signage apparatuses, game apparatuses, notebook computers, monitors, cameras, camcorders, home appliances, etc.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The technology according to the present disclosure may have the following configurations.

solution 1. A light emitting display apparatus comprising:
- a plurality of pixels each including a plurality of subpixels;
- a plurality of data lines respectively connected with the plurality of subpixels; and
- a plurality of reference lines in each of the plurality of pixels,
- wherein each of the plurality of subpixels comprises:
  - a pixel circuit connected with a corresponding data line and a corresponding reference line; and
  - a light emitting device layer connected with the pixel circuit,
  - a first subpixel group among the plurality of subpixels in each of the plurality of pixels is connected with a corresponding reference line, and
  - a second subpixel group except the first subpixel group among the plurality of subpixels in each of the plurality of pixels is connected with a reference line connected with an adjacent different pixel.

solution 2. The light emitting display apparatus of solution 1, wherein each of the plurality of pixels further comprises:
- a first connection line connected between a subpixel of the first subpixel group and the corresponding reference line; and
- a second connection line connected between a subpixel of the second subpixel group and a reference line in the adjacent different pixel.

solution 3. The light emitting display apparatus of solution 2, wherein, in each of the plurality of pixels, the first connection line overlaps a portion of the data line, and the second connection line does not overlap the data line.

solution 4. The light emitting display apparatus of solution 1, wherein a first pixel and a last pixel of the plurality of pixels, arranged in a second direction perpendicular to a first direction which is a length direction of the reference line, are dummy pixels.

solution 5. The light emitting display apparatus of solution 2, wherein the plurality of data lines are at each of a left side and a right side of the reference line with the reference line therebetween.

solution 6. The light emitting display apparatus of solution 5, wherein one of the plurality of data lines at each of the left side and the right side does not overlap all of the first connection line and the second connection line.

solution 7. The light emitting display apparatus of solution 2, further comprising a driving power line provided in each of the plurality of pixels.

solution 8. The light emitting display apparatus of solution 7, wherein the driving power line overlaps the second connection line.

solution 9. The light emitting display apparatus of solution 2, wherein the first connection line and the second connection line are provided on the same layer as the reference line.

solution 10. The light emitting display apparatus of solution 9, wherein the first connection line and the second connection line comprise the same material as a material of the reference line.

solution 11. The light emitting display apparatus of solution 2, further comprising an insulation layer provided between the first and second connection lines and the plurality of data lines.

solution 12. The light emitting display apparatus of solution 4, wherein a first connection line corresponding to each of the plurality of pixels adjacent to one another in the first direction overlaps different data lines.

solution 13. The light emitting display apparatus of solution 4, wherein a second connection line corresponding to each of the plurality of pixels adjacent to one another in the first direction does not overlap different data lines.

solution 14. The light emitting display apparatus of solution 7, further comprising a third connection line connecting second connection lines, provided in each of the plurality of pixels, with each other.

solution 15. The light emitting display apparatus of solution 14, wherein the third connection line connects second connection lines, corresponding to each of the plurality of pixels adjacent to one another in a first direction which is a length direction of the reference line, with each other.

solution 16. The light emitting display apparatus of solution 15, wherein the third connection line extends vertically from the second connection line corresponding to each of the plurality of pixels adjacent to one another in the first direction.

solution 17. The light emitting display apparatus of solution 15, wherein the second connection lines of pixels adjacent to each other in the first direction are symmetrical with each other with the third connection line therebetween.

solution 18. The light emitting display apparatus of solution 15, wherein the third connection line does not overlap the plurality of data lines.

solution 19. The light emitting display apparatus of solution 15, wherein the third connection line is between the driving power line and the plurality of data lines.

solution 20. The light emitting display apparatus of solution 15, wherein the third connection line comprises the same material as a material of each of the first connection line and the second connection line.

solution 21. A light emitting display apparatus comprising:

a plurality of pixels each including a plurality of subpixels, wherein the plurality of subpixels include a green subpixel, a red subpixel, a white subpixel and a blue subpixel;

a plurality of data lines respectively connected with the plurality of subpixels; and a plurality of reference lines in each of the plurality of pixels, wherein each of the plurality of subpixels comprises a pixel circuit connected with a corresponding data line and a corresponding reference line, a first subpixel group among the plurality of subpixels in each of the plurality of pixels is connected with a corresponding reference line, wherein the first subpixel group includes the green subpixel, the red subpixel and the white subpixel, and a second subpixel group except the first subpixel group among the plurality of subpixels in each of the plurality of pixels is connected with a reference line connected with an adjacent different pixel, wherein the second subpixel group includes the blue subpixel.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus, comprising:

a plurality of pixels, each including a plurality of subpixels;

a plurality of data lines respectively connected with the respective plurality of subpixels; and a plurality of reference lines in each of the plurality of pixels, wherein each of the plurality of subpixels comprises:

a pixel circuit connected with a corresponding data line and a corresponding reference line; and a light emitting device layer connected with the pixel circuit, a first subpixel group among the plurality of subpixels in each of the plurality of pixels being connected with a first reference line, and a second subpixel group different from the first subpixel group among the plurality of subpixels in each of the plurality of pixels being connected with second reference line connected with an adjacent different pixel, wherein:

each of the plurality of pixels comprises:

a first connection line connected between a subpixel of the first subpixel group and the corresponding reference line, and a second connection line connected between a subpixel of the second subpixel group and the second reference line in the adjacent different pixel; and in each of the plurality of pixels, the first connection line overlaps a portion of the data line, and the second connection line does not overlap the data line.

2. The light emitting display apparatus of claim 1, wherein a first pixel and a last pixel of the plurality of pixels, arranged in a second direction perpendicular to a first direction which is a length direction of the reference line, are dummy pixels.

3. The light emitting display apparatus of claim 1, wherein the plurality of data lines are at each of a left side and a right side of the respective reference line with the respective reference line therebetween.

4. The light emitting display apparatus of claim 3, wherein one of the plurality of data lines at each of the left side and the right side does not overlap all of the first connection line and the second connection line.

5. The light emitting display apparatus of claim 1, further comprising a driving power line provided in each of the plurality of pixels.

6. The light emitting display apparatus of claim 5, wherein the driving power line overlaps the second connection line.

7. The light emitting display apparatus of claim 1, wherein the first connection line and the second connection line are provided on the same layer as the first reference line.

8. The light emitting display apparatus of claim 7, wherein the first connection line and the second connection line comprise the same material as a material of the first reference line.

9. The light emitting display apparatus of claim 1, further comprising an insulation layer provided between the first and second connection lines and the plurality of data lines.

10. The light emitting display apparatus of claim 2, wherein a first connection line corresponding to each of the plurality of pixels adjacent to one another in the first direction overlaps different data lines of the plurality of data lines.

11. The light emitting display apparatus of claim 2, wherein a second connection line corresponding to each of the plurality of pixels adjacent to one another in the first direction does not overlap different data lines of the plurality of data lines.

12. The light emitting display apparatus of claim 5, further comprising a third connection line connecting a first set of second connection lines, provided in each of the plurality of pixels, with each other.

13. The light emitting display apparatus of claim 12, wherein the third connection line connects a second set of second connection lines, corresponding to each of the plurality of pixels adjacent to one another in a first direction which is a length direction of the first reference line, with each other.

14. The light emitting display apparatus of claim 13, wherein the third connection line extends vertically from the second connection line corresponding to each of the plurality of pixels adjacent to one another in the first direction.

15. The light emitting display apparatus of claim 13, wherein the second connection lines of pixels adjacent to each other in the first direction are symmetrical with each other with the third connection line therebetween.

16. The light emitting display apparatus of claim 13, wherein the third connection line does not overlap the plurality of data lines.

17. The light emitting display apparatus of claim 13, wherein the third connection line is between the driving power line and the plurality of data lines.

18. The light emitting display apparatus of claim 13, wherein the third connection line comprises the same material as a material of each of the first connection line and the second connection line.

19. A light emitting display apparatus, comprising:

a plurality of pixels, each including a plurality of subpixels, wherein the plurality of subpixels includes a green subpixel, a red subpixel, a white subpixel and a blue subpixel;

a plurality of data lines respectively connected with the plurality of subpixels; and a plurality of reference lines in each of the plurality of pixels, wherein each of the plurality of subpixels includes a pixel circuit connected with a corresponding data line of the plurality of data lines and a corresponding reference line of the plurality of reference lines, wherein a first subpixel group among the plurality of subpixels in each of the plurality of pixels is connected with a first reference line, wherein the first subpixel group includes the green subpixel, the red subpixel and the white subpixel, and wherein a second subpixel group except the first subpixel group among the plurality of subpixels in each of the plurality of pixels is connected with second reference line connected with an adjacent different pixel, wherein the second subpixel group includes the blue subpixel, wherein:

each of the plurality of pixels comprises:

a first connection line connected between a subpixel of the first subpixel group and the corresponding reference line; and a second connection line connected between a subpixel of the second subpixel group and the second reference line in the adjacent different pixel, in each of the plurality of pixels, the first connection line overlaps a portion of the data line, and the second connection line does not overlap the data line.

* * * * *